United States Patent
Sinha et al.

(10) Patent No.: US 7,248,189 B2
(45) Date of Patent: Jul. 24, 2007

(54) PROGRAMMABLE SAMPLE RATE CONVERSION ENGINE FOR WIDEBAND SYSTEMS

(75) Inventors: Amit Sinha, Acton, MA (US); Tom McKinney, Harvard, MA (US)

(73) Assignee: Edgewater Computer Systems, Inc., Ottawa, Ontario (CA)

(*) Notice: Subject to any disclaimer, the term of this patent is extended or adjusted under 35 U.S.C. 154(b) by 711 days.

(21) Appl. No.: 10/703,207

(22) Filed: Nov. 6, 2003

(65) Prior Publication Data
US 2004/0117764 A1    Jun. 17, 2004

Related U.S. Application Data

(60) Provisional application No. 60/424,375, filed on Nov. 6, 2002.

(51) Int. Cl.
*H03M 7/00*    (2006.01)
(52) U.S. Cl. ...................................................... 341/61
(58) Field of Classification Search ................ 341/143, 341/61, 51
See application file for complete search history.

(56) References Cited

U.S. PATENT DOCUMENTS

| | | | |
|---|---|---|---|
| 5,389,923 A * | 2/1995 | Iwata et al. | 341/61 |
| 5,621,404 A | 4/1997 | Heiss et al. | |
| 5,982,305 A | 11/1999 | Taylor | |
| 6,288,794 B1 | 9/2001 | Honary | |
| 6,462,682 B2 * | 10/2002 | Hellberg | 341/61 |
| 6,522,275 B2 * | 2/2003 | May | 341/143 |
| 2002/0046227 A1 | 4/2002 | Goszewski et al. | |
| 2003/0025619 A1 | 2/2003 | Zhong | |

* cited by examiner

*Primary Examiner*—Brian Young
(74) *Attorney, Agent, or Firm*—Hamilton, Brook, Smith & Reynolds, P.C.

(57) ABSTRACT

A programmable hardware architecture and design methodology for the implementation of a sample rate conversion engine is presented. The conversion engine supports scalable filter taps and can be tuned to a range of interpolation and decimation requirements. The conversion engine can be used effectively in wideband systems to efficiently extract and process digital sequences with protocol specific sampling rate requirements. The conversion engine can also be used as a hardware accelerator for software defined radios and communication systems that require adaptive sampling rates.

20 Claims, 7 Drawing Sheets

PROGRAMMABLE SAMPLE RATE CONVERSION ENGINE FOR WIDEBAND SYSTEMS

RELATED APPLICATION

This application claims the benefit of U.S. Provisional Application No. 60/424,375, filed on Nov. 6, 2002. The entire teachings of the above application are incorporated herein by reference.

BACKGROUND OF THE INVENTION

In many applications, there is a need to convert a digital signal that has been sampled at a first sampling rate to another digital signal sampled at a higher second sampling rate. Sample rate conversion is a computationally intensive operation that requires real-time computations involving addition and multiplication.

FIG. 1 is a block diagram of a prior art sample rate converter 100. The sample rate converter 100 converts an input signal x[n] that includes samples that are sampled at a first sample rate $f_{in}$ to an output signal y[n] sampled at a higher second sample rate $f_{out}$. FIG. 2A is a graphical representation illustrating N=4 samples received in an input sequence of a sinusoidal signal sampled at a first sample rate $f_{in}$.

Continuing with FIG. 1, it is assumed that the ratio of the first sample rate to the second sample rate $(f_{in}/f_{out})$ is rational and can therefore be expressed as a fraction P/Q. The conversion of the input signal x[n] to the output signal y[n] is performed by performing an up-sampling function 102 on the input signal x[n] sampled at $f_{in}$, performing a filtering (interpolation) function 104 on the up-sampled signal u[n] and then performing a down-sampling function 106 on the filtered signal v[n] to provide an output signal y[n] sampled at the new higher sampling rate $f_{out}$.

The up-sampling function 102 up-samples by inserting P-1 zero value samples between successive samples in the input sequence x[n] to increase the sampling rate. The up-sampled sequence u[n] includes a plurality of samples of x[n] and P-1 zeros inserted between successive samples of x[n] and is given by:

$$u[n] = \begin{cases} x\left[\dfrac{n}{P}\right] & n = \pm mP, m \in Z \\ 0 & \text{otherwise} \end{cases}$$

For example, with P=5, 4 (P-1) zero values are inserted in the up-sampled sequence u[n] between each input signal x[n] value such that, u[0] =x[0]; u[1], u[2], u[3] and u[4] =0 and u[5] =x[1]. FIG. 2B is a graphical representation illustrating P-1 zero value samples inserted between the N samples of the sinusoidal signal shown in FIG. 2A.

Continuing with FIG. 1, the up-sampled sequence u[n] is supplied to a filtering function 104. The filtering function is typically implemented as a Finite Impulse Response (FIR) filter. A Finite Impulse Response (FIR) filter has pre-defined filtering coefficients h[n] with which to perform interpolation. The filtering function is numerically intensive when converting to a higher sampling rate. To provide a filtered sequence v[n], the up-sampled sequence u[n] is passed through a series of delays, the output of each delay u[k] is multiplied by a respective coefficient h[n-k] and all the resulting products are added together.

Assuming the filtering function 104 has NP filtering coefficients h[n], the filtered sequence v[n] is given by:

$$v[n] = \sum_{k=n-NP+1}^{n} h[n-k]u[k]$$

where N is the number of samples and h(n-k) are pre-stored filtering coefficients of the filter.

To regenerate the data at the desired sampling rate, the filtered signal v[n] is down-sampled to provide an output signal y[n], which only includes samples at the new sampling rate. Each filtered sample in the filtered signal v[n] is dependent on the previous NP values of up-sampled sequence u[n] input to the filter. The down-sampling operation 106 down-samples by taking every $Q^{th}$ sample from the up-sampled sequence v[n] to provide the output sequence y[n]. Thus, the output sequence {y[n] y[n+1] y[n+2] . . . } corresponds to {u[n] u[n+Q] u[n+2Q] . . . }. FIG. 2C is a graphical representation illustrating Q samples of the sinusoidal signal shown in FIG. 2B.

FIG. 3 is a block diagram of a prior art Finite Impulse Response (FIR) filter 104. The up-sampled sequence of samples u[n] is passed through a series of delays 300. The output of each delay 300 is multiplied by a respective pre-stored coefficient of the filter h[n-k] and the results are added in an accumulator 304. In an embodiment with the ratio of the first sample rate to the second sample rate $(f_{in}/f_{out})$ expressed as a fraction P/Q, there are 4 samples per cycle of the input sequence (N=4), 4 zero value samples (P=5) are inserted between each of the 4 samples and there are 20 (NP) taps. Thus, each filtered sample v[n] requires 20 Multiply and Accumulate (MAC) cycles and is computed as follows:

$v[n+0] = \{h[0]\ h[1]\ h[2]\ \ldots\ h[19]\}\ \{u[n+0]\ u[n-1]\ u[n-2]\ \ldots\ u[n-19]\}$ Thus, as the number of samples in the input sequence and the output sequence increases, the number of MAC cycles and taps in the filter increases accordingly. As is well known in the art of digital signal processing, there are restrictions on the sampling rate; that is, the sampling rate must be at least twice the highest frequency of the signal that is being sampled (Nyquist sampling rate), so that the sampled signal can be reconstructed without aliasing.

As the number of taps are increased, the number of Multiply-and-Accumulate (MAC) cycles to generate each successive output may make it unfeasible to compute the output sequence in real-time or with restricted hardware.

SUMMARY OF THE INVENTION

A scalable, efficient, programmable, hardware architecture for a sample rate conversion engine is presented. A sample rate conversion engine for upconversion, filtering with a set of filtering coefficients applied to delayed samples and down conversion includes a multiplier accumulator unit, a sample delay line and a bank of coefficient registers. Each register in the bank of coefficient registers contains a reduced set of the set of filtering coefficients to be applied to input samples for each of successive outputs. The sample rate conversion engine also includes control logic which, for each of the successive outputs, selects a reduced set of filtering coefficients from the bank of coefficient registers and a reduced set of samples from the sample delay line to be applied to the multiplier accumulator unit.

The sequence of multiply operations performed in the MAC processing unit and the sets of filtering coefficients stored in the coefficient registers are selected dependent on the conversion ratio P/Q and the number of multipliers N in the MAC unit, so that computations are not performed for intermediate samples u[n] that are later discarded by the down-sampling function. The sequence of multiply operations is also selected so that computations are not performed for the P-1 interpolated zero valued samples that have no affect on the output signal y[n]. Thus, the number of multipliers required to derive the output samples is less than in the prior sample rate converter described in conjunction with FIG. 1.

The bank of coefficient registers is programmable, allowing the conversion rate to be varied by modifying the reduced sets of filtering coefficients stored in the bank of coefficient registers. The number of reduced sets of filtering coefficients stored in the bank of coefficient registers is dependent on a number of interpolated zero samples and the number of reduced sets of samples is dependent on the output sampling rate. The number of multipliers in the multiplier accumulator unit is fixed.

In one sample, with a conversion ratio P/Q, the number of multipliers is N and the number of sets (banks) of filtering coefficients is P. To compute successive Q output samples one of the sets of filtering coefficients is applied to each of Q sets of input samples in the multiplier accumulator unit.

The reduced set of filtering coefficients in each bank is $h[(r*P)+(n*Q \pmod P)]$, a reduced set of input samples is $x([((n*(Q/P))-r)]$ and a successive output y[n] is the product of the reduced set of filtering coefficients and the reduced set of input samples for r=0 to N−1.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 4:
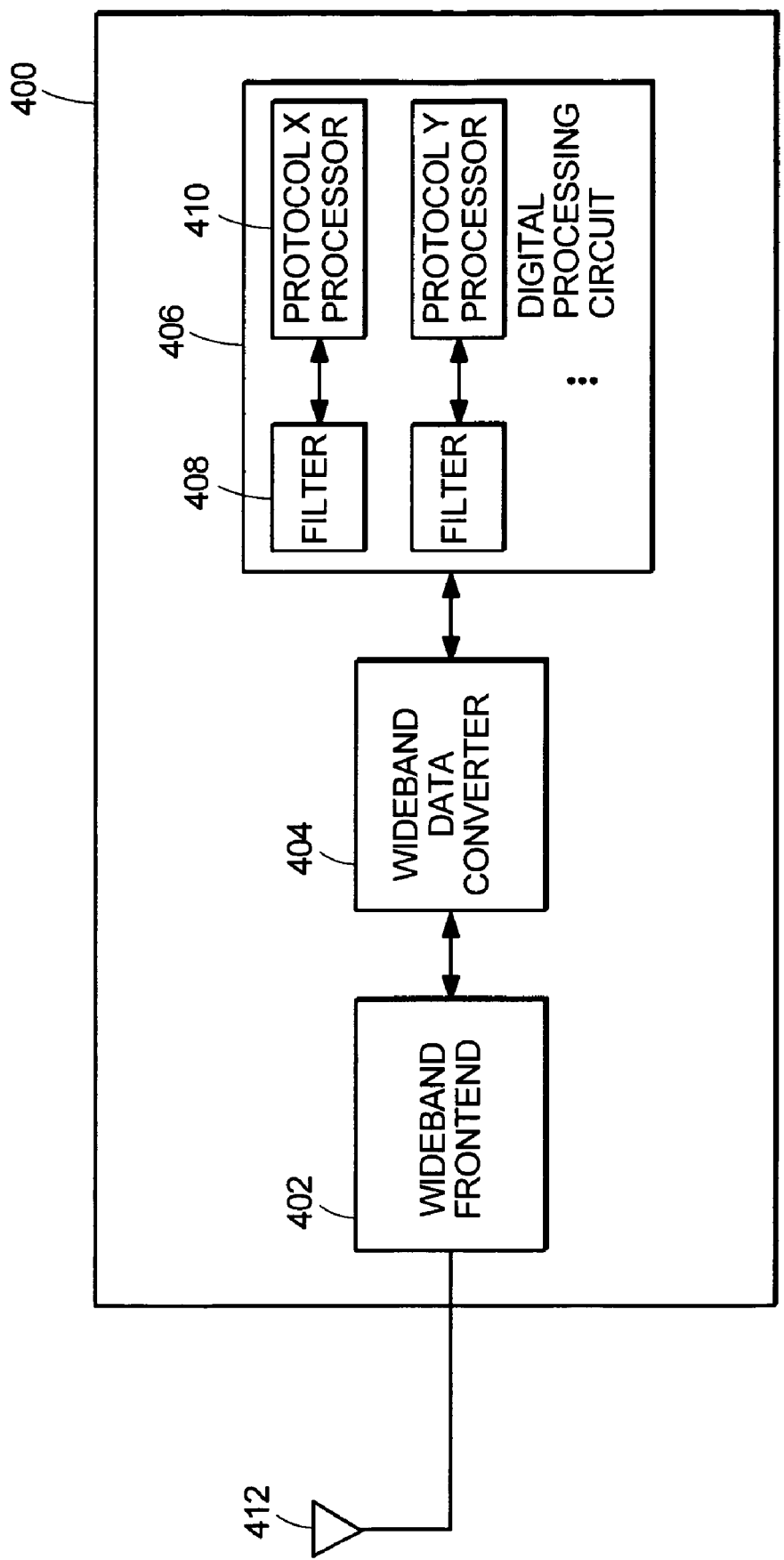
FIG. 4 is a block diagram of a wideband system including a sample rate conversion engine according to the principles of the present invention.

FIG. 4 is a block diagram of a wideband system 400 including a sample rate conversion engine according to the principles of the present invention. Wideband signals received by an antenna 412 from mobile clients are coupled to a wideband radio frequency front end circuit 402 which amplifies the received signals and converts high frequency signals to a baseband signal. One such wideband signal is three simultaneous channels of the Institute of Electrical and Electronics Engineers (IEEE) 802.11 g wireless Local Area Network (LAN) protocol which can consist of three non-overlapping 22 MHz channels simultaneously in a 83.5 Mhz range referred to as the 2.4 GHz band. The IEEE 802.11 g protocol is one of a family of IEEE 802.11 wireless LAN protocols that includes modulation schemes with different sampling rates.

The amplified signal is coupled to a wideband data converter 404. The wideband data converter 404 includes a high speed, high resolution Analog to Digital (A/D) and a Digital to Analog (D/A) converter. The Analog to Digital (A/D) converter digitizes received wideband signals for subsequent digital signal processing by a digital processor. For example, the 2.4 GHz wideband signal can be digitized by a 200 MHz A/D converter.

The high sampling rate and bit resolution offered by the A/D data converter enables the design of systems where multiple data channels and/or protocols can be processed simultaneously and cost effectively. A fundamental requirement in such wideband multi-protocol systems is the ability to seamlessly change sampling rates based on protocol specific requirements.

The data in the received wideband signal is modulated using modulation schemes such as Orthogonal Frequency Division Multiplexing (OFDM) and Direct Sequence Spread Spectrum (DSSS) modulation. OFDM modulates with a sample rate of 20 Msps and DSSS modulates with a with a sample rate of 11 Msps. The IEEE 802.11 g wireless LAN protocol supports both OFDM and DSSS.

The digital signal is forwarded to a digital processing circuit 406 for processing. To support the ability to change sampling rates based on the 802.11 g wireless LAN protocol, a filter 408 in the digital processing circuit 409 includes a sample rate conversion engine which converts received signals with a sampling rate of 11 Msps to signals with a sampling rate of 20 Msps. After the sampling rate has been converted in the filter, the converted signal is forwarded for further processing to a protocol processor 410.

Figure 1:
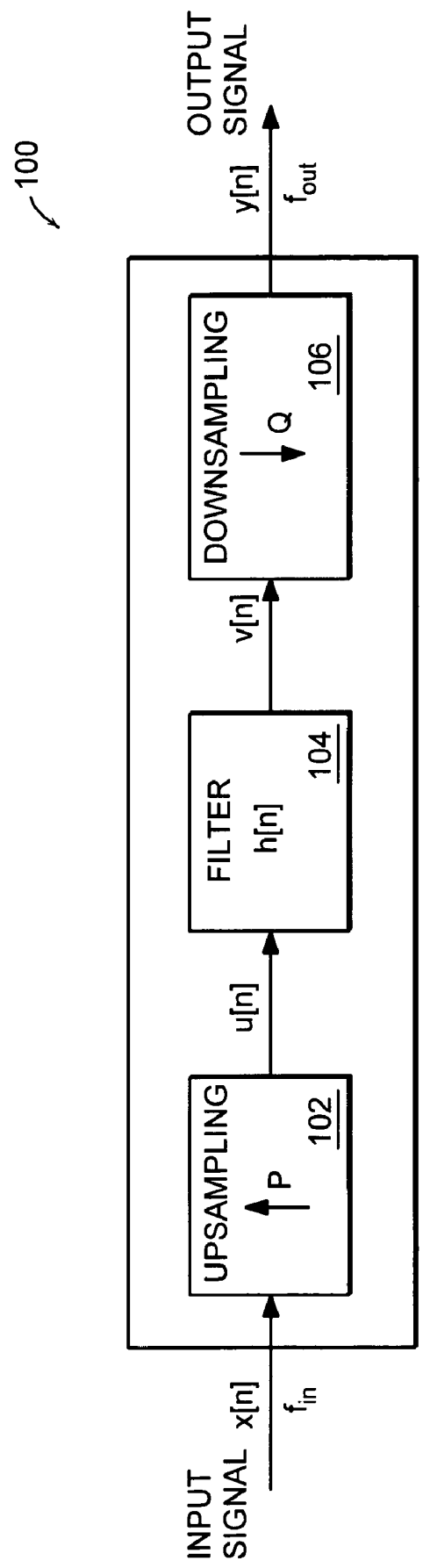
FIG. 1 is a block diagram of a prior art sample rate converter.
Figure 2A:
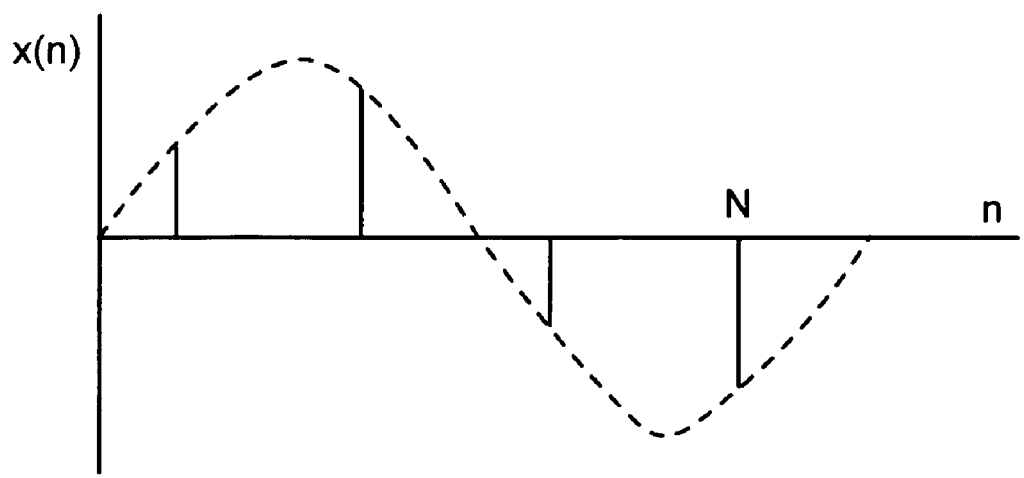
FIG. 2A is a graphical representation illustrating N samples of a sinusoidal signal received in an input sequence.
Figure 2B:
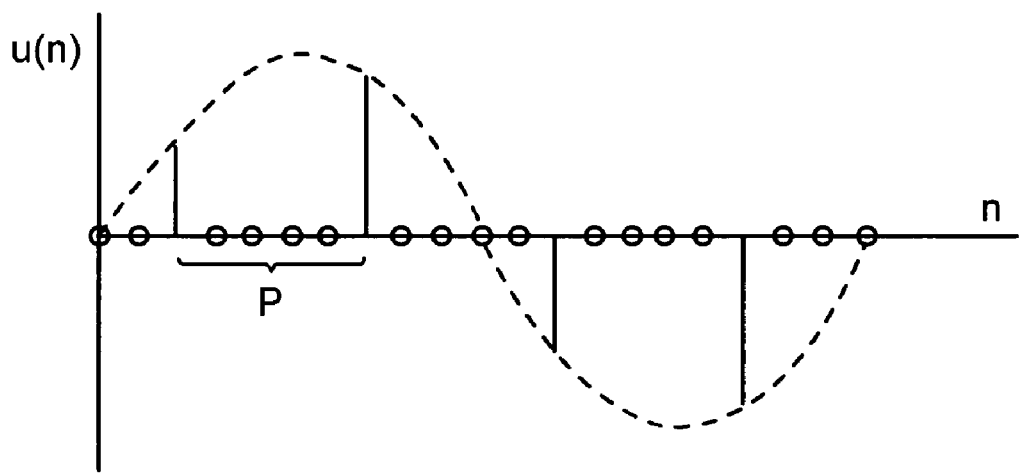
FIG. 2B is a graphical representation illustrating P-1 samples inserted between N samples of the sinusoidal signal shown in FIG. 3A.
Figure 2C:
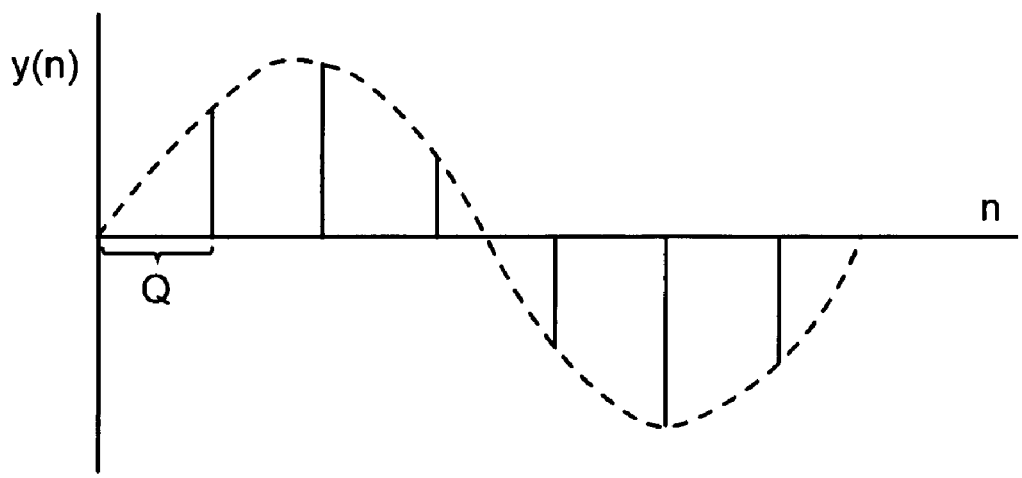
FIG. 2C is a graphical representation illustrating Q samples of the sinusoidal signal shown in the FIG. 3B.
Figure 3:
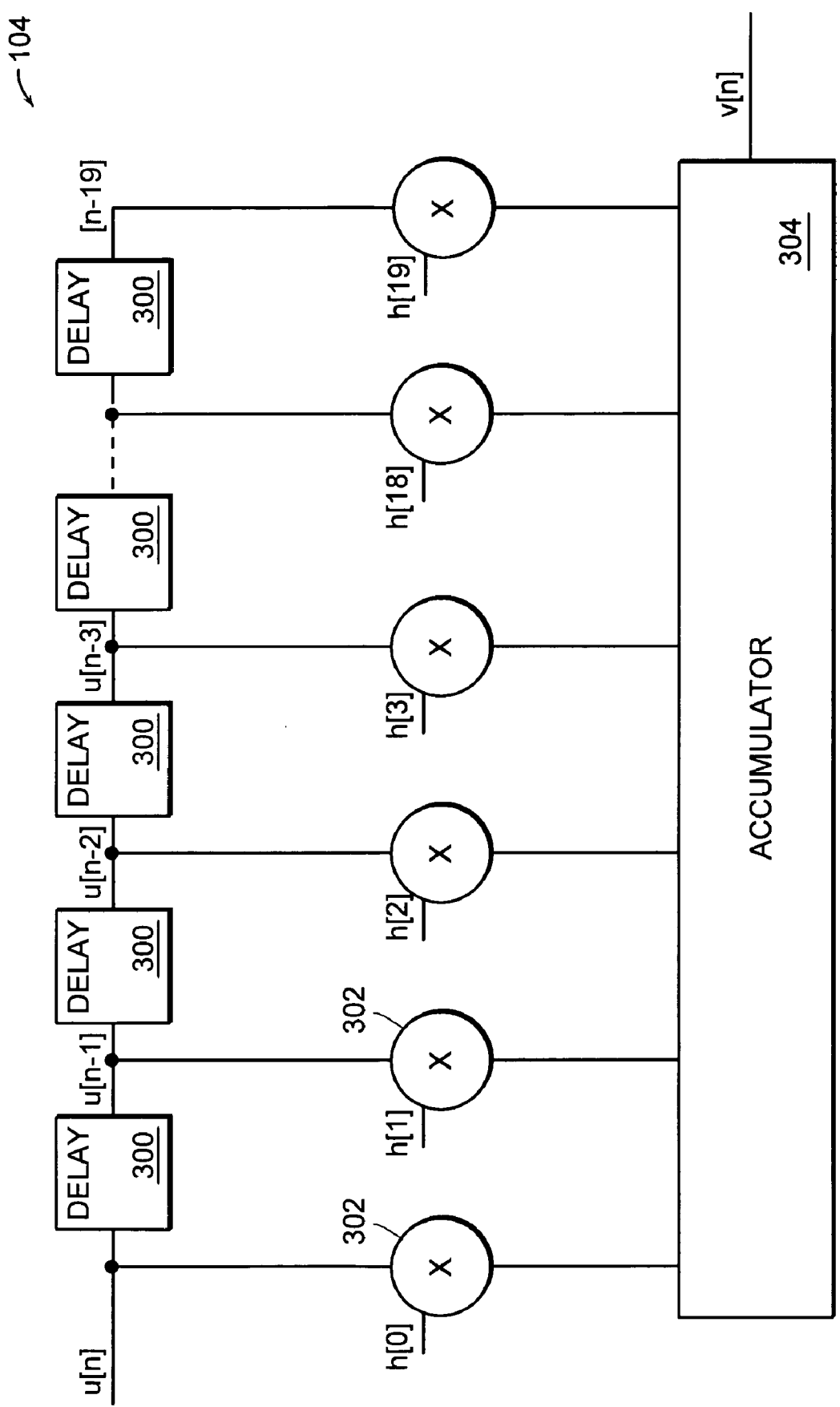
FIG. 3 is a block diagram of a prior art Finite Impulse Response (FIR) filter.
Figure 5:
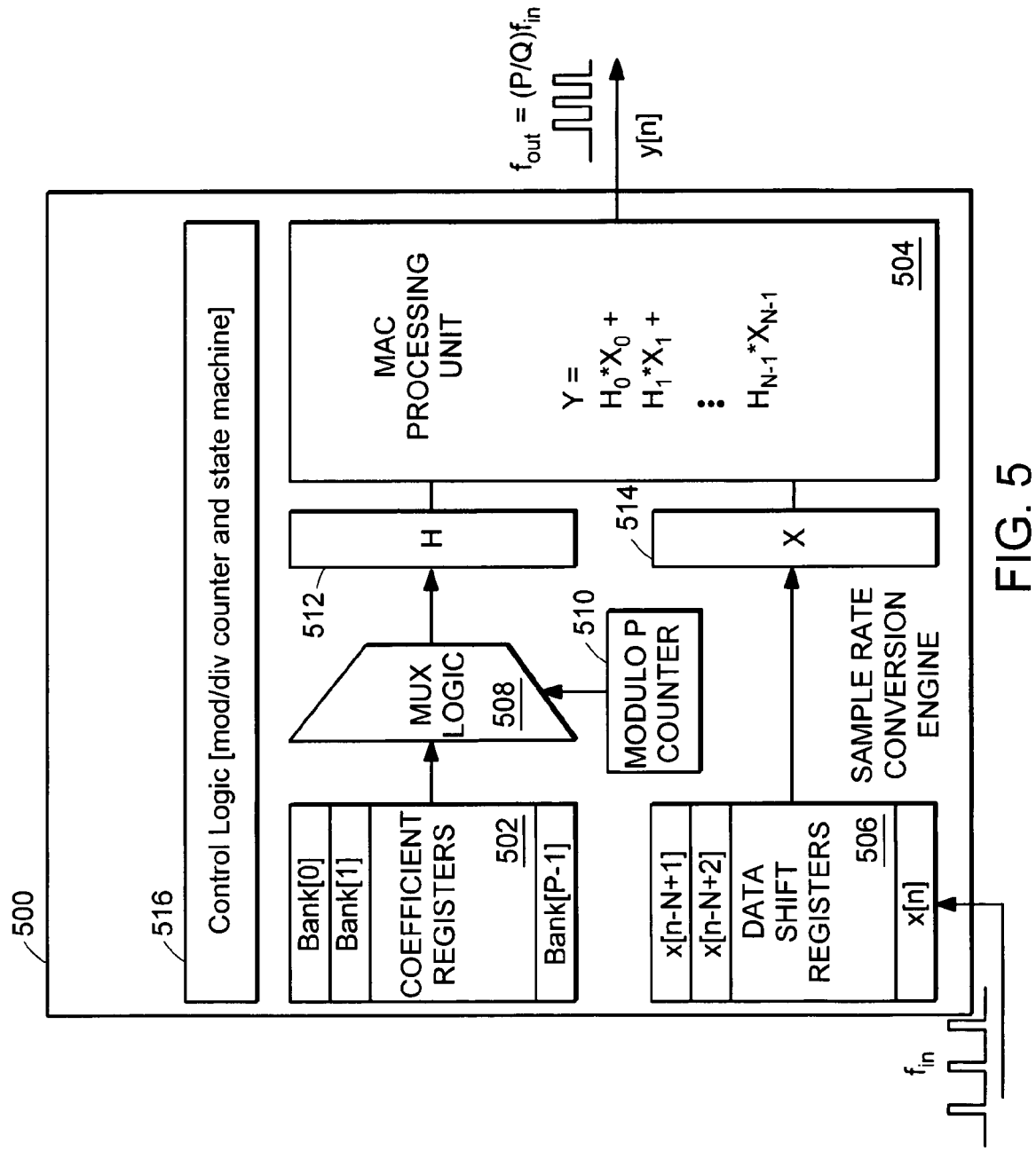
FIG. 5 is a block diagram of a sample rate conversion engine 500 in any one of the filters 408 shown in FIG. 4.

FIG. 5 is a block diagram of a sample rate conversion engine 500 in any one of the filters 408 shown in FIG. 4. The sample rate conversion engine 500 replaces the up-sampling, filtering and down-sampling functions described in conjunction with the prior art converter shown in FIG. 1.

The input sequence x[n] includes a plurality of samples that are sampled at an input sampling rate $f_{in}$. Sample rate conversion engine 500 minimizes the number of computations by computing output sequence samples y[n] directly from input sequence samples x[n] in the Multiplier and Accumulator (MAC) processing unit 504. The input sampling rate is $f_{in}$ and the desired output sampling rate is $f_{out}$, the ratio $f_{out}/f_{in}$ is rational and can therefore be expressed as a fraction P/Q.

The MAC processing unit 504 includes N multipliers and an N-input adder capable of computing one sample of the output y[n] in a single cycle. A reduced number of computations per output sample y[n] are performed using a subset of the NP filtering coefficients h[n] for successive output samples y[n].

An ordered sequence of P reduced sets of filtering coefficients are stored sequentially in a bank of P coefficient registers 502. Each coefficient register in the bank of coefficient registers 502 stores a reduced set of N filtering coefficients, one filtering coefficient per multiplier in the MAC processing unit 504. The ordered sequence of P reduced sets of filtering coefficients (filter banks) is modular; that is, the sequence is repeated for every P output samples.

The reduced set of filtering coefficient inputs 512 are applied in parallel, from successive filter banks (coefficient registers), for each output sample y[n] computed. Under control of the control logic 516, a modulo P counter 510 selects a reduced set of filtering coefficients to be applied to the MAC processing unit 504 through mux logic 508 and a bank of coefficient (H) inputs 512.

A sample delay line implemented by an N deep shift register 506 buffers successive input samples x[n]. The data shift registers 506 are also controlled by the control logic 516. Every incoming data sample x[n] is associated with an input data valid signal that is set to a logic "high" for a single clock cycle of the engine. The average frequency of the input data valid pulses corresponds to the input sampling rate $f_{in}$.

The engine 500 issues output data valid pulses with an average frequency $f_{out}=(P/Q)f_{in}$. Control logic 516 synchronizes the input samples x[n] and output samples y[n] in such a way that for every Q input samples x[n] shifted in, P output samples y[n] are computed. For the example, with Q=3 and P=5, the control logic issues data valid pulses to the data shift register 506 such that for every 3 samples shifted in, 5 output samples are computed.

The sequence of multiply operations performed in the MAC processing unit 504 and the sets of filtering coefficients stored in the coefficient registers 502 are selected dependent on the conversion ratio P/Q and the number of multipliers N in the MAC unit, so that computations are not performed for intermediate samples u[n] that are later discarded by the down-sampling function. The sequence of multiply operations is also selected so that computations are not performed for the P-1 interpolated zero valued samples that have no affect on the output signal y[n]. Thus, the number of multipliers required to derive the output samples is less than in the prior sample rate converter described in conjunction with FIG. 1.

The bank of coefficient registers 502 are software programmable through control logic 516 allowing different conversion rates to be supported; that is, the re-sampling ratio P/Q is variable. The number of multipliers in the MAC processing unit 504 is fixed. Thus, only the number of coefficient registers is modified when the conversion ratio P/Q is modified.

The sequence of multiply operations to be performed with a reduced set of multipliers for a sampling ratio P/Q is derived as follows. As described in conjunction with FIG. 1, the up-sampling operation inserts P-1 zero valued samples between successive samples of x[n]. The up-sampled sequence u[n] includes the plurality of samples of x[n] and P-1 zero valued samples inserted between successive samples of x[n] and is given by:

$$u[n] = \begin{cases} x\left[\dfrac{n}{P}\right] & n = \pm mP, m \in Z \\ 0 & \text{otherwise} \end{cases}$$

Assuming the interpolating filter has NP taps, where N is the number of samples in the input sequence, the interpolated sequence v[n] is given by $$v[n] = \sum_{k=n-NP+1}^{n} h[n-k]u[k]$$

The number of interpolated sequence values computed can be reduced, knowing that the P-1 zeros do not add to the accumulator. Substituting for index variable k such that $$k = \left\lfloor \dfrac{n}{P} \right\rfloor P - rP$$

the following expression for the interpolated sequence v[n] is obtained $$v[n] = \sum_{r=0}^{N-1} h[rP + n(\bmod P)]x\left[\left\lfloor \dfrac{n}{P} \right\rfloor - r\right]$$

Knowing that only every Qth sample is output as the output signal y[n], i.e. v[nQ]. The output sequence y[n] is obtained by taking every $Q^{th}$ sample from v[n]:

$$y[n] = v[nQ] = \sum_{r=0}^{N-1} h[rP + nQ(\bmod P)]x\left[\left\lfloor \dfrac{nQ}{P} \right\rfloor - r\right]$$

Thus, from the above expression for y[n], the output signal y[n] can be selected directly from the input sequence x[n] by observing the following:

(i) The total number of Multiply and Accumulate (MAC) operations required per output sample y[n] is N for an NP tap interpolation. (ii) A sequence of P consecutive output samples y[n] uses P distinct, non-overlapping filter banks where each filter bank is a subset of N coefficients from the set of NP coefficients, with one of the N coefficients used for each of the N MAC operations. (iii) For a given re-sampling ratio, P/Q, the P filter banks are uniquely determined and the NP coefficients can be reorganized into P groups of N coefficients each and stored in sequential memory locations. (iv) The input sample x[n] selection is determined by the ratio Q/P and dependent on this ratio, input samples may be reused or skipped in successive computations of y[n]. The P reduced sets of filtering coefficients are pre-computed for a P/Q ratio and stored in the coefficient registers.

Table 1 illustrates P reduced sets of coefficients selected from the set of NP coefficients stored in P coefficient registers 502. Each output sample y[n] requires N=4 Multiply and Accumulate (MAC) cycles. The ratio of the input sampling rate to the output sampling rate is P/Q where P=5 and Q=3. The operation for each output sample y[n] is represented by a dot product between vectors in Table 1.

The P reduced sets of N filtering coefficients for computing output samples y[n+0]-y[n+4] shown in Table 1 are stored in the bank of coefficient registers 502. The first vector represents the reduced set of N coefficient values h[n] stored in the coefficient registers 504. The second vector represents the subset of input samples in the data shift registers 506 to be applied to the reduced set of coefficient values. In this example there are P=5 co-efficient registers with non-overlapping coefficients. For subsequent samples of y[n], the coefficients stored in the coefficient registers are used in the same order. The input samples are dithered in the ratio Q/P=3/5 with respect to the output samples, i.e., for every 5 output samples of y, only 3 input samples of x are used.

TABLE 1

| Output | Computation |
|---|---|
| y[n + 0] | {h[0] h[5] h[10] h[15]} · {x[n + 0] x[n − 1] x[n − 2] x[n − 3]} |
| y[n + 1] | {h[3] h[8] h[13] h[18]} · {x[n + 0] x[n − 1] x[n − 2] x[n − 3]} |
| y[n + 2] | {h[1] h[6] h[11] h[16]} · {x[n + 1] x[n + 0] x[n − 1] x[n − 2]} |
| y[n + 3] | {h[4] h[9] h[14] h[19]} · {x[n + 1] x[n + 0] x[n − 1] x[n − 2]} |
| y[n + 4] | {h[2] h[7] h[12] h[17]} · {x[n + 2] x[n + 1] x[n + 0] x[n − 1]} |
| y[n + 5] | {h[0] h[5] h[10] h[15]} · {x[n + 3] x[n + 2] x[n + 1] x[n + 0]} |
| y[n + 6] | {h[3] h[8] h[13] h[18]} · {x[n + 3] x[n + 2] x[n + 1] x[n + 0]} |

The filter has 20 taps (NP=20), thus, there are twenty coefficient values h[0]-h[19]. There are 4 (N=4) multipliers in the multiplier accumulator unit, therefore a reduced set of four of the set of twenty coefficient values h[0]-h[19] and a reduced set of four samples from the sample delay line are applied to the multiplier accumulator unit 504 to compute each output sample y[n]. Each reduced set of coefficient values is selected so that zero valued interpolation samples are not computed. Only every Qth sample is computed, that is, y[n]=v[Qn], thus, three subsets (Q=3) of input samples are selected to compute each five (P=5) successive output sample values.

The coefficients stored in the filter banks are computed are based on the following expression for y[n]:

$$y[n] = v[nQ] = \sum_{r=0}^{N-1} h[rP + nQ(\text{mod } P)] x\left[\left\lfloor \frac{nQ}{P} \right\rfloor - r\right]$$

The set of operations to be performed for each output sample y[n] for a conversion ratio of P/Q with N=4, P=5 and Q=3, is shown in Table 1. Referring to Table 1, the subset of coefficient values for y[n+0]; that is, h[0], h[5] h[10], h[15] are computed by substituting n=0, P=5 and Q=3 in the expression for y[n], that is, r*5+0 *3(mod 5), for r=0 to 3. The subset of coefficient values for y[n+1]; that is, h[3], h[8] h[13], h[18] are computed by substituting n=1 and P=5 in the expression for y[n] for r=0 to 3; that is, r*5+1*3 (mod 5), where 3(mod 5)=3 (the remainder resulting from dividing 3 by 5). The input data samples are shifted by one sample to compute the next output sample y[n+2]. The subset of coefficient values for y[n+2]; that is, h[1], h[6] h[11], h[16] are computed by substituting n=2, Q=3 and P=5 in the expression for y[n] for r=0 to 3. The subset of coefficients for y[n+3] are computed in a similar manner with n=3. The input data samples are shifted by one sample to compute the next output sample y[n+4] with n=4. Thus, by appropriate selection of filtering coefficients no computations are performed for the P-1 inserted zero values and output samples that are later discarded are not computed.

The resampling engine 500 is programmable to support a range of re-sampling ratios given by (P,Q) where $P_{min} \leq P \leq P_{max}$ and $Q_{min} \leq Q \leq Q_{max}$. The MAC processing unit 504 is clocked at a maximum speed that sets the limit on the maximum input and output sampling rate that can be supported. Noise is introduced during resampling by aliasing of unsuppressed images. The minimum attenuation required to suppress images introduced during upsampling is based on a minimum signal to noise ratio (SNR) allowed for rate conversion. The maximum number of taps is dependent on minimum attenuation required and the maximum up-sampling rate $P_{max}$ to be supported. This determines the size of the coefficient register array ($NP_{max}$) and the number of MACs required in the resampling engine (N).

Figure 6A:
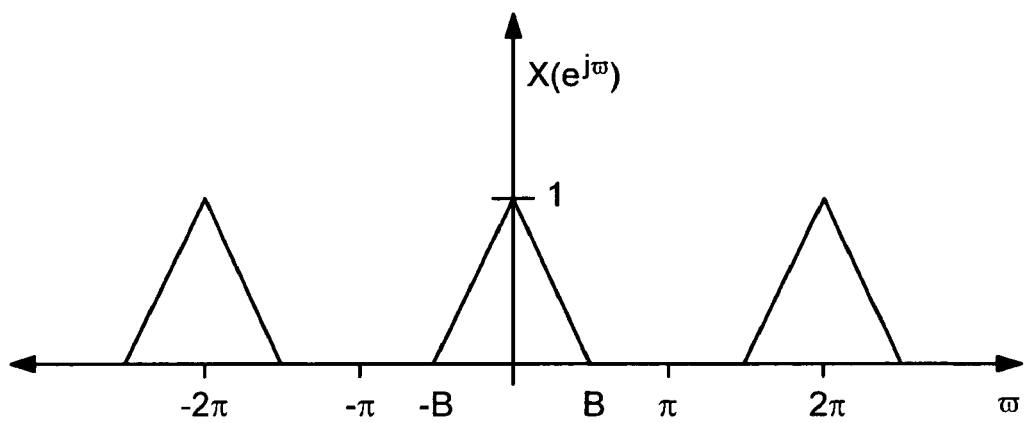
FIGS. 6A-C illustrate spectral considerations during interpolation.
Figure 6B:
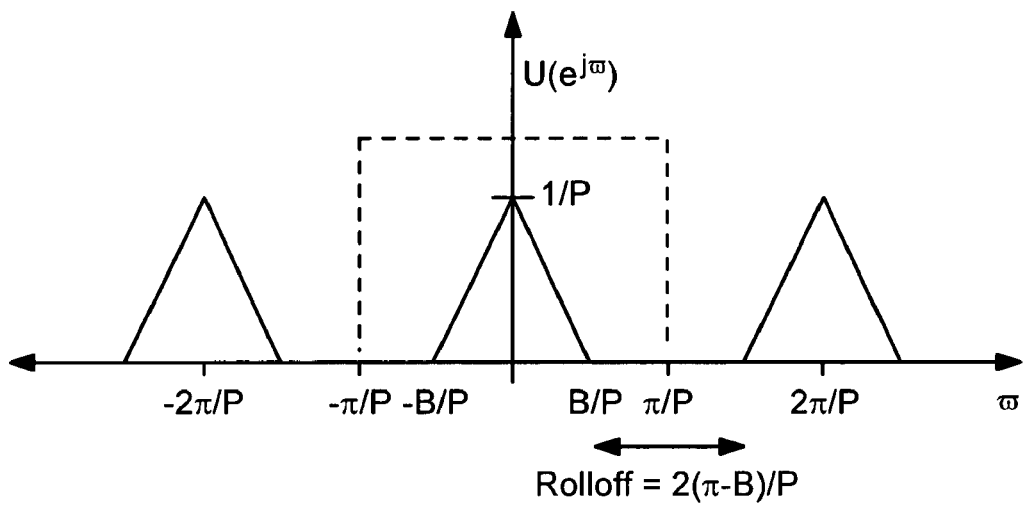
Figure 6C:
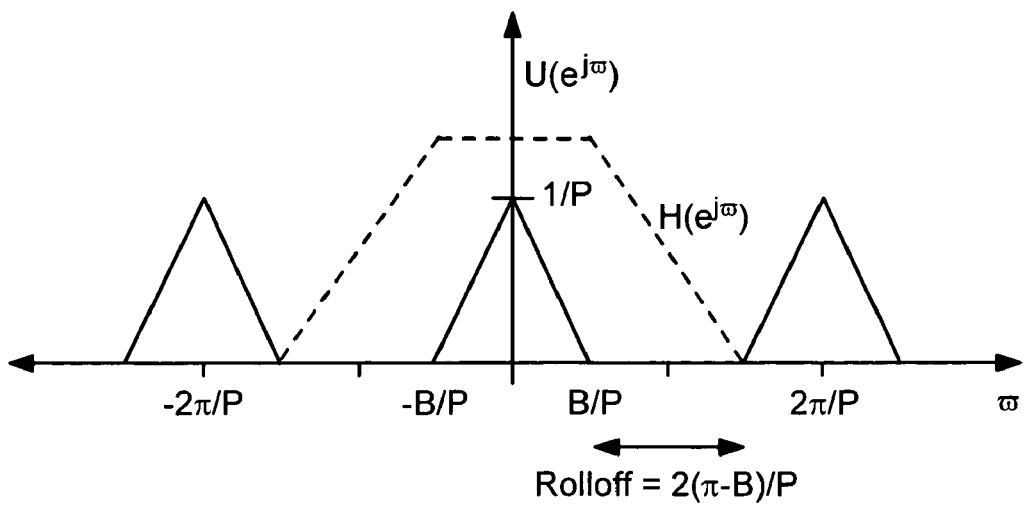

FIGS. 6A-C illustrate spectral considerations during interpolation. FIG. 6A is a graph illustrating the discrete spectrum of the input signal x[n]. It is assumed that the resampling engine 500 is being used for pure rate conversion and therefore the input signal is already band limited so as not to suffer from aliasing due to down-sampling for any ratio P/Q within the allowed range (assuming ideal image rejection during interpolation).

FIG. 6B is a frequency domain representation of the up-sampled output signal $u(e^{jw})$ after the up-sampling process introduces P-1 images in the discrete spectrum of the input signal x[n] shown in FIG. 6A. If the bandwidth of the input signal x (normalized such than $f_{in}$ corresponds to $2\pi$) is B, the bandwidth of the equivalent upsampled signal u is B/P with the first image centered at $2\pi/P$. As shown, an ideal low pass filter, with cutoff at $\pi/P$ and a gain of P in the passband would result in perfect interpolation.

Perfect interpolation with no aliasing requires an ideal filter if the input signal x is sampled at the Nyquist rate, that is, the bandwidth $B=\pi$. However, such a filter is impossible to realize in a real system because the transition bandwidth is zero. In practice, signals are usually oversampled such that $B<\pi$. The greater the transition bandwidth, the easier it is to realize a filter. Since the spectral images are equal in power, an efficient equiripple, low pass Finite Impulse Response (FIR) filter can be used to suppress the spectral images below a specified level in the stopband.

FIG. 6C is a graph illustrating a low pass Finite Impulse Response (FIR) filter with a transition bandwidth (roll-off) of $2(\pi-B)/P$ for filtering the interpolated output signal.

Figure 7:
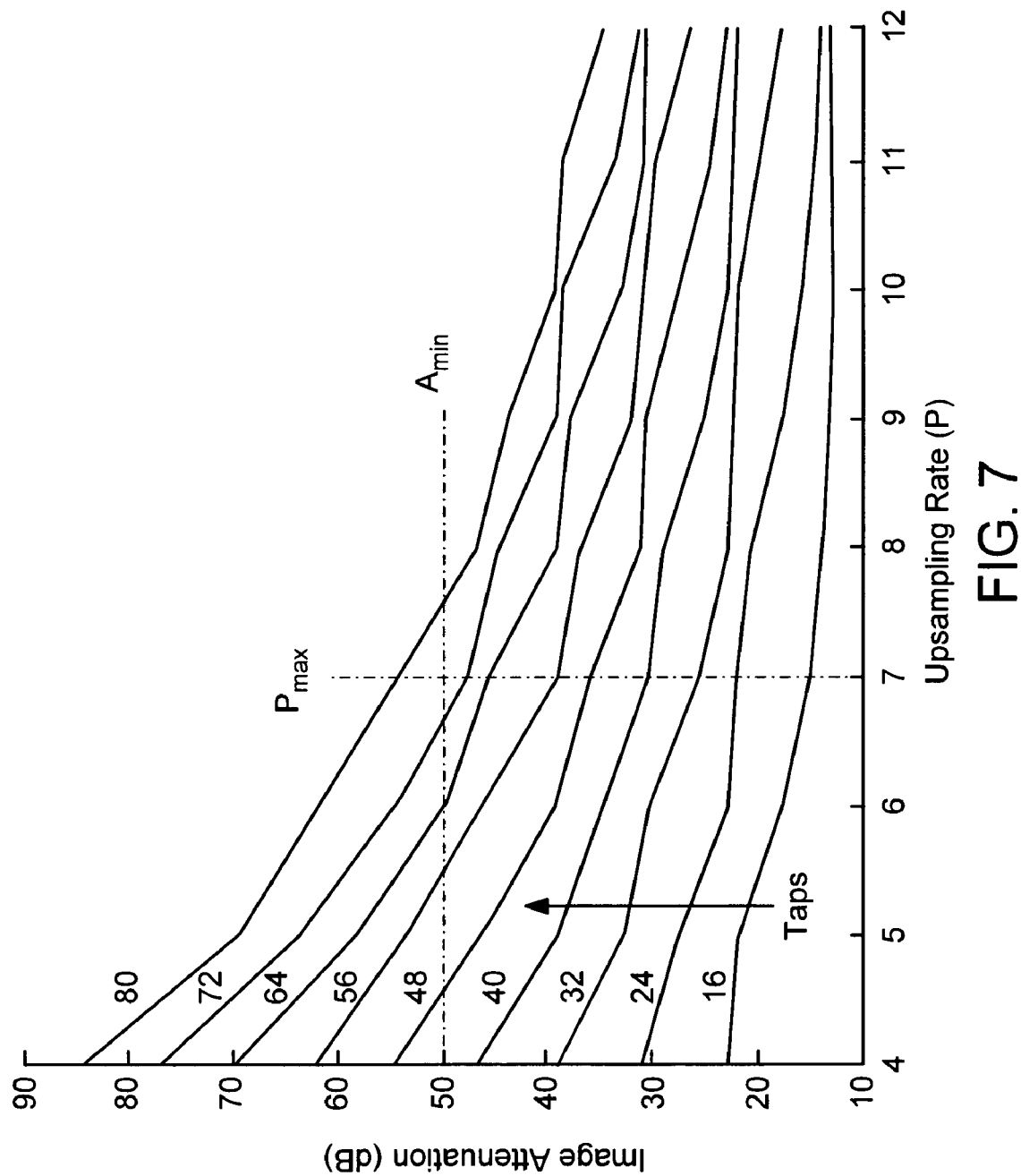
FIG. 7 is a graph illustrating the minimum stopband attenuation of images obtained using equiripple FIR filters, designed with the Remez algorithm, as a function of the number of taps and the upsampling ratio P.

FIG. 7 is a graph illustrating the minimum stopband attenuation of images obtained using equiripple FIR filters, designed with the Remez algorithm, as a function of the number of taps and the upsampling ratio P. As is well-known to those skilled in the art, the Remez algorithm provides a "equal-ripple" filter by minimizing the peak or maximum ripple in the passband and the stopband by making all the peaks in the ripple equal to each other. The input signal bandwidth (i.e., the bandwidth to be preserved in the resampling process) used in FIG. 6A is $B=\pi/2$. As this bandwidth increases, the attenuation obtained for the same number of taps and upsampling rate decreases.

The transition bandwidth is minimum when the upsampling ratio is $P_{max}$, thus the maximum number of filter taps ($P_{max}$ N) is required to obtain the desired attenuation. Assuming the maximum input signal bandwidth is $B_{max}$, similar curves for attenuation as a function of filter taps and upsampling rate can be obtained. Thus, the number of taps can be computed for a range of minimum attenuation values and sampling rates. As shown, for an attenuation of 50 dB at an upsampling rate of 7, a filter with 72 taps required.

If the range of re-sampling ratios is limited and more flexibility is desired, a plurality of engines can be cascaded in series such that $$\frac{P}{Q} = \frac{P_1}{Q_1}\frac{P_2}{Q_2}\ldots$$

where $P_k/Q_k$ are the re-sampling ratios of the $k^{th}$ engine. In such cascaded systems, the re-sampling is distributed uniformly over individual engines.

The engine has been described for use in a wideband system to efficiently extract and process digital sequences with protocol specific sampling rate requirements. The engine can also be used as a hardware accelerator for software defined radios and for communication systems that require adaptive sampling rates.

While this invention has been particularly shown and described with references to preferred embodiments thereof, it will be understood by those skilled in the art that various changes in form and details may be made therein without departing from the scope of the invention encompassed by the appended claims.

What is claimed is:

1. A sample rate conversion engine for upconversion, filtering with a set of filtering coefficients applied to delayed samples and down conversion comprising:
    a multiplier accumulator unit;
    a sample delay line;
    a bank of coefficient registers, each containing a reduced set of the set of filtering coefficients to be applied to input samples for each of successive outputs; and
    control logic which for each of the successive outputs selects a reduced set of filtering coefficients from the bank of coefficient registers and a reduced set of samples from the sample delay line to be applied to the multiplier accumulator unit.

2. The sample rare conversion engine of claim 1, wherein the reduced set of the set of filtering co-efficients is selected to include only filtering co-efficients to be applied to non-zero samples.

3. The sample raw conversion engine of claim 2, wherein the reduced set of input samples are selected to only compute output samples.

4. The sample rate conversion engine of claim 1, wherein the bank of coefficient registers is programmable.

5. The sample rate conversion engine of claim 1, wherein a conversion rate is variable.

6. The sample rate conversion engine of claim 5, wherein the conversion rate is varied by modifying the reduced sets of filtering coefficients stored in the bank of coefficient registers.

7. The sample rate conversion engine of claim 1, wherein the number of reduced sets of filtering coefficients stored in the bank of coefficient register is dependent on a number of interpolated zero samples.

8. The sample rate conversion engine of claim 1, wherein the number of reduced sets of samples is dependent on the output sampling rate.

9. The sample rare conversion engine of claim 1, wherein a number of multipliers in the multiplier accumulator unit is fixed.

10. The sample rate conversion engine of claim 1, wherein the conversion ratio is P/Q, the number of multipliers is N and the number of sets of filtering coefficients is P, to compute successive Q output samples one of the sets of filtering coefficients is applied to each of Q sets of input samples in the multiplier accumulator unit.

11. The sample rate conversion engine claim 1, wherein the conversion ratio is P/Q, the number of multipliers is N, the reduce set of the set of filtering coefficients stored in the bank is h[rP+nQ (mod P)] and a reduced set of input samples is x(nQ
    P)−r] and a successive output y[n] is the product of the reduced set of filtering coefficients and the reduced set of input samples for r=0 to N−1.

12. A method of up converting, filtering with a set of filtering coefficients applied to delayed samples and down converting comprising
    storing reduced sets of the set of filtering coefficients to be applied to input samples for each of successive outputs within a programmable bank of coefficient registers; and
    for each of the successive outputs, selecting a reduced set of filtering coefficients and a reduced set of samples from a sample delay line to be applied to a multiplier accumulator unit.

13. The method of claim 12, wherein a conversion rate is variable.

14. The method of claim 13, wherein the conversion rate is varied by modifying the reduced sets of filtering coefficients stored in the bunk of coefficient registers.

15. The method of claim 12, wherein the number of reduced sets of filtering coefficients stored in the bank of coefficient register is dependent on a number of interpolated zero samples.

16. The method of claim 12, wherein the number of reduced sets of samples is dependent on the output sampling rate.

17. The method of claim 12, wherein a number of multipliers in the multiplier accumulator unit is fixed.

18. The method of claim 12, wherein the conversion ratio is P/Q, the number of multipliers is N and the number of sets of filtering coefficients is P, to compute successive Q output samples one of the sets of filtering coefficients is applied to each of Q sets of input samples in the multiplier accumulator unit.

19. The method of claim 12, wherein the conversion ratio is P/Q, the number of multipliers is N, the reduced set of filtering coefficients is h[rP+nQ (mod P) and a reduced set of input samples is x(nQ/P)−r] and a successive output y[n] is the product of the reduced set of filtering coefficients and the reduced set of input samples for r=0 to N−1.

20. A sample rate conversion engine for upconversion, filtering with a set of filtering coefficients applied to delayed samples and down conversion comprising:
    means for storing; reduced sets of the set of filtering coefficients to be applied to input samples for each of successive outputs within a programmable bank of coefficient registers; and
    for each of the successive outputs, means for selecting a reduced set of filtering coefficients and a reduced set of samples from sample delay line to be applied to a multiplier accumulator unit.

* * * * *

UNITED STATES PATENT AND TRADEMARK OFFICE
CERTIFICATE OF CORRECTION

PATENT NO. : 7,248,189 B2 Page 1 of 1
APPLICATION NO. : 10/703207
DATED : July 24, 2007
INVENTOR(S) : Amit Sinha and Tom McKinney It is certified that error appears in the above-identified patent and that said Letters Patent is hereby corrected as shown below:

Column 9

At Claim 2, line 39, delete "rare" and insert --rate--;

At Claim 3, line 43, delete "raw" and insert --rate--;

At Claim 9, line 61, delete "rare" and insert --rate--;

Column 10

At Claim 11, line 5, insert --of-- before "claim";

At Claim 11, lines 9 and 10, delete "x(nQP)-r]" and insert -- x(nQ/P)-r] --; and At Claim 14, line 29, delete "bunk" and insert --bank--.

Signed and Sealed this

Twenty-third Day of October, 2007

JON W. DUDAS
*Director of the United States Patent and Trademark Office*